United States Patent
Kobayashi et al.

(10) Patent No.: US 6,884,649 B2
(45) Date of Patent: Apr. 26, 2005

(54) METHOD FOR MANUFACTURING PIEZOELECTRIC FILM, PIEZOELECTRIC ELEMENT AND INK JET RECORDING HEAD

(75) Inventors: Motokazu Kobayashi, Kanagawa (JP); Toshiya Yuasa, Kanagawa (JP); Makoto Kubota, Kanagawa (JP); Shinji Eritate, Kanagawa (JP); Fumio Uchida, Osaka (JP); Chiemi Shimizu, Osaka (JP); Kenji Maeda, Gifu (JP)

(73) Assignees: Canon Kabushiki Kaisha, Tokyo (JP); Fuji Chemical Co. Ltd., Osaka (JP)

(*) Notice: Subject to any disclaimer, the term of this patent is extended or adjusted under 35 U.S.C. 154(b) by 0 days.

(21) Appl. No.: 10/665,422

(22) Filed: Sep. 22, 2003

(65) Prior Publication Data

US 2004/0132221 A1 Jul. 8, 2004

(30) Foreign Application Priority Data

Sep. 20, 2002 (JP) .................................. 2002-275750

(51) Int. Cl.$^7$ ............................................. H01L 21/00
(52) U.S. Cl. ..................... 438/50; 438/3; 438/381
(58) Field of Search .............................. 438/48–54, 3, 438/381, 761–762, 785

(56) References Cited

U.S. PATENT DOCUMENTS

| | | | |
|---|---|---|---|
| 5,164,920 A | * 11/1992 | Bast et al. | 367/140 |
| 6,277,294 B1 | 8/2001 | Ozaki et al. | 216/27 |
| 6,331,259 B1 | 12/2001 | Ozaki et al. | 216/27 |
| 6,382,775 B1 | 5/2002 | Kubota et al. | 347/62 |
| 6,391,527 B1 | 5/2002 | Yagi et al. | 430/313 |
| 6,436,301 B1 | 8/2002 | Hiroki et al. | 216/27 |
| 6,474,780 B1 | 11/2002 | Kubota et al. | 347/45 |

FOREIGN PATENT DOCUMENTS

| | | |
|---|---|---|
| JP | 9-92897 | 4/1997 |
| JP | 10-139594 | 5/1998 |
| JP | 10-290035 | 10/1998 |

OTHER PUBLICATIONS

C. V. R. Vusant Kumar, et al., "Lead Zirconate Titanate Films by Rapid Thermal Processing," Appl. Phys. Lett., vol. 58, No. 11, Mar. 18, 1991, pp. 1161–1163.

* cited by examiner

Primary Examiner—H. Jey Tsai
(74) Attorney, Agent, or Firm—Fitzpatrick, Cella, Harper and Scinto

(57) ABSTRACT

The invention provides a method for manufacturing a piezoelectric element including a coating step of coating a substrate with a coating liquid for forming the piezoelectric element thereby forming a coated film, a drying step of drying the coated film, a preliminary sintering step of preliminarily sintering the coated film thereby forming an oxide film, a final sintering step of finally sintering the oxide film thereby forming a piezoelectric film, and a cooling step of cooling the piezoelectric film, wherein the steps are executed in the presence of a moisture-containing gas; in the coating step the substrate has a temperature equal to or less than 50° C. and the moisture-containing gas has a relative humidity of 60% RH or less at 25° C.; in the drying step, the substrate has a temperature equal to or less than 200° C. and the relative humidity is 10 to 70% RH; in the preliminary sintering step the substrate has a temperature of 200 to 450° C. and the relative humidity is 70 to 100% RH; in the final sintering step the substrate has a temperature of 500 to 800° C. and the relative humidity is 70 to 100% RH.

5 Claims, 3 Drawing Sheets

METHOD FOR MANUFACTURING PIEZOELECTRIC FILM, PIEZOELECTRIC ELEMENT AND INK JET RECORDING HEAD

BACKGROUND OF THE INVENTION

1. Field of the Invention

The present invention relates to a method for manufacturing a piezoelectric film, a piezoelectric element and an ink jet recording head utilizing such piezoelectric element.

2. Related Background Art

A piezoelectric element is constituted of piezoelectric crystalline ferroelectric or paraelectric ceramics. The piezoelectric ceramics generally have a two-component system principally constituted of lead zirconate-titanate (hereinafter also represented as PZT), or a three-component system in which a third component is added to PZT of the two-component system. A ferroelectric substance employing the two-component PZT is described in Applied Physics Letters 1991, vol. 58, No. 11, pp1161–1163.

For forming a ferroelectric thin film of such metal oxide type, there are known a sputtering method, an MOCVD method and a sol-gel method.

The sol-gel method is executed by coating a substrate with a solution containing a hydrolysable compound of each component metal constituting a raw material, a partially hydrolyzed product or a partially condensed-polymerized product thereof (hereinafter also represented as a coating liquid), then drying the coated film, heating it in the air to form a metal oxide film and finally sintering the film at a temperature equal to or higher than a crystallizing temperature of the metal oxide to crystallize the film thereby obtaining a ferroelectric film. As the hydrolysable compound of the raw material, there is generally employed an organic compound such as a metal alkoxide, a partially hydrolyzed product thereof or a partially polymerized-condensed product thereof. The sol-gel method is suitable for easily and inexpensively forming a ferroelectric film.

As a method similar to the sol-gel method, there is known a metallorganic decomposition method (represented also as MOD method). The MOD method is executed by coating a substrate with a solution of a thermally decomposable organometallic compound constituting a raw material component, for example a β-diketone complex or a carboxylate salt of a metal to form a coated film, heating it for example in the air or in oxygen to eliminate a solvent in the coated film and to thermally decompose the metal compound thereby forming a film of a metal oxide, and finally sintering the film at a temperature equal to or higher than a crystallizing temperature thereby crystallizing the film. In the present invention, the sol-gel method, the MOD method and a mixed method thereof are collectively called sol-gel method.

There is also disclosed an ink jet printing head utilizing a piezoelectric element employing a film formed by the sol-gel method. For example, Japanese Patent Applications Laid-open Nos. 9-92897, 10-139594 and 10-290035 disclose a method forming a piezoelectric thin film of a piezoelectric element usable for an ink jet printing head, by the sol-gel method, by coating a sol containing a piezoelectric material plural times on a lower electrode and repeating a heating process. Also, for the purpose of improving the performance and the durability of the ink jet recording head, there have been made various proposals in improving the characteristics and the operation reliability of a piezoelectric element used as an actuator, as disclosed for example in Japanese Patent Applications Laid-open Nos. 9-92897, 10-139594 and 10-290035.

As explained in the foregoing, there have been made various proposals for improving the characteristics and the operation reliability of a piezoelectric element used as an actuator, in order to improve the performance and the durability of the ink jet recording head.

SUMMARY OF THE INVENTION

It is generally considered difficult to prepare a desired piezoelectric element by simply dissolving an ordinary metal complex or a metal salt of an organic acid in a solvent. Also for use as a desired actuator, the characteristics as a piezoelectric element have to be uniform on the film surface, and a highly dense film is desired for attaining durability. From the standpoint of the manufacture of a piezoelectric element, it is considered more efficient to obtain a larger film thickness in a single layer to be formed, and necessary to have measures for attaining such thickness.

The present invention has been made to solve these issues, and an object is to provide a piezoelectric element with satisfactory electrical characteristics, a method for forming a piezoelectric film and an ink jet recording head employing such piezoelectric film.

Another object of the present invention is to provide a method for manufacturing a piezoelectric element including a coating step of coating a substrate with a coating liquid for forming a piezoelectric member thereby forming a coated film, a drying step of drying the coated film, a preliminary sintering step of preliminarily sintering the coated film thereby forming an oxide film, a final sintering step of finally sintering the oxide film thereby forming a piezoelectric film, and a cooling step of cooling the piezoelectric film, wherein the above-mentioned steps are executed in the presence of a gas containing moisture; the substrate in the coating step has a temperature equal to or less than 50° C. and the moisture-containing gas has a relative humidity of 60% RH or less at 25° C.; the substrate in the drying step has a temperature equal to or less than 200° C. and the moisture-containing gas has a relative humidity of 10 to 70% RH; the substrate in the preliminary sintering step has a temperature of 200 to 450° C. and the moisture-containing gas has a relative humidity of 70 to 100% RH; the substrate in the final sintering step has a temperature of 500 to 800° C. and the moisture-containing gas has a relative humidity of 70 to 100% RH.

The piezoelectric element manufactured by the method of the present invention exhibits an excellent performance and an excellent durability when employed for example as a piezoelectric element of an ink jet recording head. Also the ink jet recording head of the present invention shows a high responsiveness and a satisfactory ink discharging property even at a frequency range as high as 15 to 20 kHz.

DETAILED DESCRIPTION OF THE PREFERRED EMBODIMENTS

In the following, there will be explained embodiments of the present invention.

Figure 1:
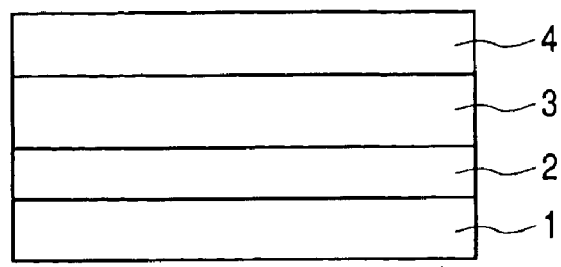
FIG. 1 is a cross-sectional view schematically showing a piezoelectric element of the present invention.

FIG. 1 is a schematic cross-sectional view showing the configuration of a piezoelectric element of the present invention, wherein shown are a substrate 1, a lower electrode 2, a piezoelectric film 3 and an upper electrode 4.

There is preferably employed a semiconductor substrate such as of silicon (Si) or tungsten (W), but there can also be employed a ceramic material such as zirconia, alumina or silica.

A lower electrode 2 and an upper electrodes 4 of the piezoelectric element of the present invention are formed by a conductive layer of a thickness of about 5 to 500 nm. More specifically, there is employed one or more of metals such as Ti, Pt, Ta, Ir, Sr, In, Sn, Au, Al, Fe, Cr, Ni etc. and oxides thereof in a laminar form.

The lower electrode 2 and the upper electrode 4 may be constituted of a layer of the aforementioned metal, formed on the substrate by sputtering or evaporation, or of a layer of the aforementioned oxide, formed on the substrate by coating and finally sintering by a sol-gel method etc. or by sputtering or evaporation. Also each of the lower electrode and the upper electrode may be patterned in a desired shape.

A piezoelectric film 3 contains at least one of elements Pb, La, Zr and Ti as a constituent element, and can be prepared for example by a sol-gel method.

In the following, there will be explained a method for manufacturing a piezoelectric element of the present invention, taking a case of preparation of the piezoelectric element by a sol-gel method as an example.

In the sol-gel method, a piezoelectric element is usually prepared by preparing a coating liquid which includes a raw material component capable of generating a metal oxide constituting the piezoelectric film 3, coating it on a substrate to form a coated film, drying the coated film and further finally sintering such coated film.

The coating liquid including a raw material component capable of generating a constituent component of the piezoelectric film can be usually obtained by dissolving an alkoxide of Pb, La, Zr, Ti etc. or a metal salt thereof in a solvent, then adding water for executing a hydrolysis to obtain a reaction product (a raw material component capable of generating a constituent component of the piezoelectric film), and adding other additives to such reaction product if necessary.

The piezoelectric film 3 may be doped with an element of a trace amount other than Pb, La, Zr and Ti. Specific examples of the trace element usable for doping include Ca, Sr, Ba, Sn, Th, Y, Sm, Ce, Bi, Sb, Nb, Ta, W, Mo, Cr, Co, Ni, Fe, Cu, Si, Ge, Sc, Mg, Mn etc.

Its content is normally 0.05 or less in atomic fraction in case constituent components of the piezoelectric film are represented by a general formula $Pb_{1-x}La_x(Zr_yTi_{1-y})O_3$ (wherein $0 \leq x < 1$, $0 \leq y \leq 1$). Examples of the solvent in the hydrolysis reaction include an alcoholic solvent such as methanol, ethanol, n-propanol, isopropanol, n-butanol, s-butanol, or t-butanol; an ether solvent such as tetrahydrofuran or 1,4-dioxane; a cellosolve solvent such as 2-methoxyethanol, 2-ethoxyethanol, or 1-methoxy-2-propanol; a polyhydric alcohol such as diethylene glycol monoethyl ether, diethylene glycol monoethyl ether acetate, diethylene glycol monobutyl ether, or diethylene glycol monobutyl ether acetate; an amide solvent such as N,N-dimethylformamide, N,N-dimethylacetamide or N-methylpyrrolidone; and a nitrile solvent such as acetonitrile. An amount of such solvent employed in the hydrolysis reaction is normally 5 to 200 times in moles with respect to metal alkoxide or metal salt, preferably 10 to 100 times in moles. An excessively large amount of the solvent renders gelation difficult, while an excessively small amount causes a significant heat generation in hydrolysis.

Examples of alkoxide of lead include lead 2-ethoxyethoxide, lead methoxide, lead ethoxide, lead n-propoxide, lead i-propoxide, lead n-butoxide, lead i-butoxide, lead t-butoxide and alkyl substituted compounds thereof.

It is also possible to employ a Pb salt, more specifically an inorganic salt compound such as a chloride, a nitrate, a phosphate or a sulfate, or an organic salt compound for example a carboxylate such as a formate, an acetate, a propionate, an oxalate, a succinate or a malate, a hydroxycarboxylate, an acetylacetonate complex etc. Such salt may be also be employed by mixing with a solvent reacting with water to synthesize in situ an alkoxide.

La, Zr or Ti may also be employed in an alkoxide compound or a salt in a similar manner.

In case of doping with a trace element other than Pb, La, Zr and Ti, a compound containing such metal can be added either as a solution in a solvent or directly.

A charging ratio of the aforementioned alkoxide or metal salt, for example in case of employing Pb, La, Zr and Ti, can be a ratio theoretically determined from a general formula $Pb_{(1-x)}La_x(Zr_yTi_{1-y})O_3$ (wherein $0 \leq x < 1$, $0 \leq y \leq 1$) of a metal oxide constituting the piezoelectric film, but, since Pb is lost in the course of finally sintering, it is preferred to increase the amount of Pb in advance corresponding to such loss. More specifically, it is preferred to increase the charging amount of Pb within a range of 5 to 30% with respect to the amount determined from the general formula $Pb_{(1-x)}La_x(Zr_yTi_{1-y})O_3$ (wherein $0 \leq x < 1$, $0 \leq y \leq 1$).

In a hydrolysis reaction of a metal alkoxide or a metal salt, water is employed in an amount of 0.05 to 8 times in moles of metal alkoxide or metal salt, preferably 0.5 to 4 times in moles.

In the hydrolysis reaction, there may be employed an acid catalyst or a base catalyst. For example, there can be employed a metal salt, a halide, a mineral acid such as sulfuric acid, nitric acid or hydrochloric acid, or an organic acid such as acetic acid or octylic acid. Among these, there is preferably employed an organic acid such as acetic acid or octylic acid.

The hydrolysis reaction is not particularly restricted in reaction conditions, but can be generally executed at a reaction temperature from the room temperature to 100° C. and a reaction time of 1 to 30 hours. After the solution of the above-mentioned metal composition is hydrolyzed, it is preferred to prepare a coating liquid by completely eliminating a solvent of a boiling point equal to or lower than 100° C., and adding a solvent having a boiling point equal to or higher than 100° C. in such a manner that a concentration of a hydrolysis reaction product (a raw material component capable of generating constituent components of the piezoelectric film) becomes within a range of 0.1 to 35 mass % with respect to the sum of the solvent and the hydrolysis reaction product.

Examples of the employable solvent include a cellosolve such as 1-methoxy-2-propanol, 2-ethoxyethanol, or 3-methoxy-3-methylbutanol; a polyhydric alcohol such as diethylene glycol monoethyl ether or diethylene glycol monoethyl ether acetate; and an incense oil such as terpineol, pine oil or lavender oil. There is preferred a cellosolve solvent. It is also possible to use a cellulose derivative such as ethyl cellulose or hydroxypropyl cellulose, a polymer resin such as polyvinyl alcohol, polyvinylpyrrolidone or a polyvinylpyrrolidone derivative, rosin or a rosin derivative, for a purpose of improving the coating property.

The aforementioned coating liquid is coated on a lower electrode formed on a substrate. The coating can be made by a known coating method such as spin coating, dip coating, bar coating or spray coating. In this coating step, it is preferred that the substrate has a temperature equal to or lower than 50° C., and an existing gas, containing moisture, has a relative humidity equal to or lower than 60% RH (relative humidity). A relative humidity equal to or less than 60% RH is preferred as a hydrolysis of the coated liquid on the substrate proceeds with an appropriate speed without a fear of precipitate formation.

A film thickness per layer after drying is not particularly restricted, but is preferably from 0.01 to 5 μm. Also a total film thickness is preferably from 1 to 30 μm.

The coated film is dried at a temperature equal to or lower than 200° C. This operation is conducted with a substrate temperature equal to or lower than 200° C., and in the presence of a gas with a relative humidity of 10 to 70% at 25° C. A humidity equal to or lower than 70% RH is preferred as a hydrolysis of the coated liquid on the substrate proceeds with an appropriate speed without a fear of crack formation. Also a humidity equal to or higher than 10% RH is preferred as the hydrolysis proceeds faster whereby a temperature of a finally sintering process to be explained can be appropriately increased.

For such drying, there can be utilized a drying machine, a dryer, a hot plate, a tubular oven or an electric oven. Also a moisture-containing gas to be used in the drying step, having a relative humidity of 10 to 70% RH at 25° C., can be obtained by bubbling a desired gas in water. It is also possible to introduce a gas so conditioned with a humidifier or the like as to have a predetermined relative humidity at 25° C.

Then a preliminarily sintering is executed at a substrate temperature within a range from 200 to 450° C. to form an oxide film on the substrate. This preliminary sintering step is conducted in the presence of a moisture-containing gas of a relative humidity of 70 to 100% RH at 25° C. A humidity equal to or higher than 70% RH at 25° C. is preferred as the hydrolysis reaction proceeds rapidly. For such preliminarily sintering, there can be utilized a drying machine, a dryer, a hot plate, a tubular oven or an electric oven. A moisture-containing gas having a relative humidity of 70 to 100% RH at 25° C. can be obtained by bubbling a desired gas in water. It is also possible to introduce a gas of which humidity is conditioned with a humidifier or the like.

Then a finally sintering is executed at a substrate temperature within a range from 500 to 800° C., thereby forming, on the substrate, a piezoelectric film constituted of crystalline metal oxides. This final sintering step is conducted in the presence of a gas with a relative humidity of 70 to 100% RH at 25° C. A relative humidity equal to or higher than 70% RH is preferred as the hydrolysis proceeds without stagnation. For such finally sintering, there can be utilized a tubular oven or an electric oven. Also a moisture-containing gas having a relative humidity of 70 to 100% RH at 25° C. can be obtained by bubbling a desired gas in water. It is also possible to adjust the humidity with a humidifier or the like.

The aforementioned moisture-containing gas preferably flows at a constant speed on the surface of the coated film. A constant flow speed is preferred as it prevents stagnation of the gas and the hydrolysis of the coated liquid proceeds without stagnation. A preferred flow speed is from 0.5 to 50 cm/sec. However, a stagnation of the gas can be tolerated in case the substrate has a small region and the moisture-containing gas is present in a large excess.

A thickness, after the finally sintering, per layer formed by the coating liquid is not particularly restricted but is generally selected within a range of 0.01 to 1 μm, preferably 0.02 to 0.9 μm in consideration of working efficiency. The above-described operation may be repeated to obtain a piezoelectric film of an arbitrary thickness.

The drying step is preferably executed for each layer, but the preliminarily sintering and the finally sintering may be executed for each layer or collectively for several layers. Also the finally sintering may be executed only at last.

A moisture-containing gas present in the steps from drying to finally sintering is preferably an oxygen-containing atmosphere, preferably with an oxygen concentration equal to or higher than 20%. A concentration equal to or higher than 20% is preferred as the finally sintering proceeds adequately to easily provide a perovskite structure, thereby exhibiting desired performances.

Also the finally sintering may be executed with stepwise temperature increases. Such finally sintering allows to eliminate organic components almost completely, thereby providing a piezoelectric film of a dense structure.

Figure 2:
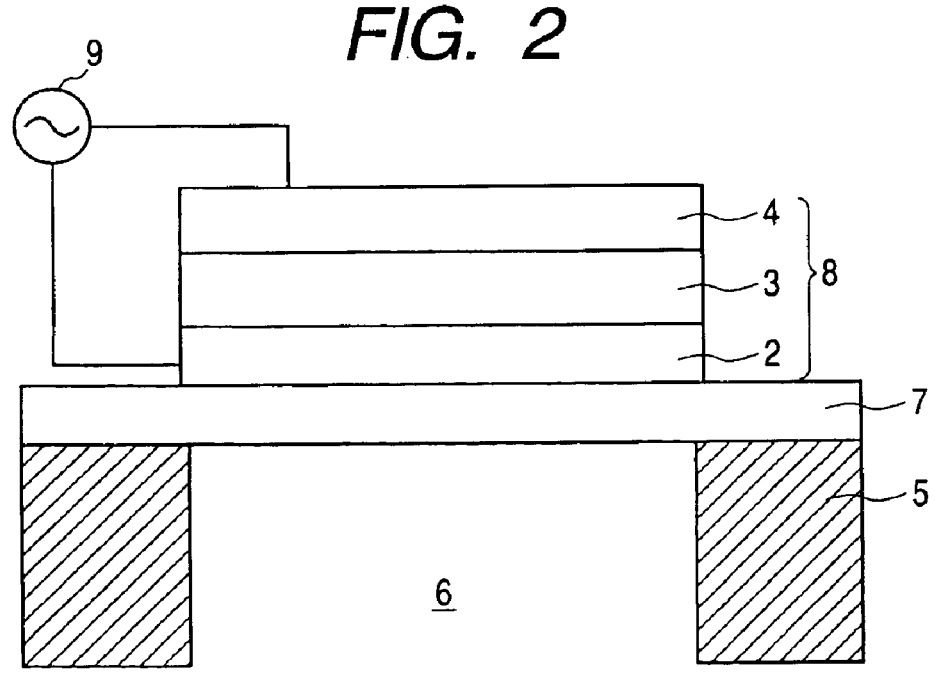
FIG. 2 is a cross-sectional view schematically showing the configuration of an actuator for an ink jet printing head, employing a piezoelectric element of the present invention.

FIG. 2 is a schematic cross-sectional view of an actuator for an ink jet printing head, utilizing a piezoelectric element of the present invention, and schematically shows, in a magnified manner, a part of the ink jet printing head employing the piezoelectric element as the actuator.

The printing head has a basic configuration same as that in the prior technology, and is constituted of a head base 5, a vibrating plate 7 and a piezoelectric element. The head base 5 is provided with a plurality of ink nozzles (not shown) for discharging ink, a plurality of ink paths (not shown) respectively communicating with the ink nozzles, and a plurality of ink chambers 6 respectively communicating with the ink paths, and the vibrating plate 7 is so mounted as to cover an entire upper surface of the head base 5, whereby the vibrating plate 7 closes upper apertures of all the ink chambers 6 of the head base 5. On the vibrating plate 7, piezoelectric elements 8 for providing the vibrating plate 7 with a vibrating force are formed in positioned respectively corresponding to the ink chambers 6. An electric power source 9 controls the plural piezoelectric elements 8 and applies a voltage to a desired piezoelectric element 8 to induce a displacement therein, thereby causing a vibration in the vibrating plate 7 in a corresponding portion. Thus an ink chamber 6, in a portion corresponding to the vibration of the vibrating plate 7, shows a change in a volume, whereby an ink is pushed out from the ink nozzle through the ink path to achieving a printing.

EXAMPLES

In the following, the present invention will be clarified in more details by examples.

Preparation Examples 1, 2, 3, 4, 5 and 6 of Coating Liquid

In these examples, coating liquids with a composition represented by $Pb_{1-y}La_yZr_{0.52}Ti_{0.48}$ (in which $0 \leq y < 1$) for forming a piezoelectric film were prepared in the following manner.

0.52 moles of zirconia n-butoxide, 0.48 moles of titanium n-butoxide and 10.0 moles of 1-methoxy-2-propanol were mixed at the room temperature, then a mixture of lead acetate hydrate (Pb) and a lanthanum acetate hydrate (La) was added, and the mixture was further heated at 70° C. whereby the raw material metal compounds were mutually complexed. Then water, acetic acid and ethanol (solvent 2) were added and agitation was conducted at 70° C. to execute a hydrolysis reaction. In this operation 1.0 mole of actylic acid was added. Also polyvinylpyrrolidone K-30 (trade name, manufactured by Wako Pure Chemical Industries Ltd.) was added as a coating property improving agent in certain examples (Examples 4 and 6).

Thereafter, the solvents having a boiling point of 100° C. or lower were completly eliminated by a rotary evaporator, and 1-methoxy-2-propanol (solvent 3) was so added that the metal oxide concentration converted into the foregoing formula became 20 wt. %.

Raw materials, solvents and amounts thereof employed in the above-described Preparation Examples are shown in Table 1.

TABLE 1

| Preparation example | Pb (mol) | La (mol) | water (mol) | Acetic acid (mol) | Solvent 2 (mol) | PVP (mol) | Solvent 3 (mol) |
| --- | --- | --- | --- | --- | --- | --- | --- |
| 1 | 1.0 | 0 | 3.0 | 1.0 | 5.0 | 0 | 15.0 |
| 2 | 1.05 | 0 | 6.0 | 1.5 | 12.0 | 0 | 20.0 |
| 3 | 1.20 | 0 | 0.5 | 4.0 | 5.0 | 0 | 15.0 |
| 4 | 1.10 | 0 | 4.0 | 15.0 | 30.0 | 0.03 | 14.0 |
| 5 | 1.05 | 0.01 | 3.0 | 0.5 | 10.0 | 0 | 15.0 |
| 6 | 1.15 | 0.01 | 1.0 | 8.8 | 30.0 | 0.1 | 11.0 |

Preparation Example 7

A coating liquid for forming piezoelectric film was prepared in the same manner as in the Preparation Example 5, except that a mixture of a lead acetate hydrate (Pb) and a lanthanum acetate hydrate (La), dehydrated in advance, was added at the reaction of zirconia and titanium and reacted simultaneously to mutually complex the raw material metal oxides.

Preparation Example 2

A coating liquid for forming piezoelectric film was prepared in the same manner as in the Preparation Example 5, except that a lead acetate hydrate (Pb) and a lanthanum acetate hydrate (La) were added and heated in a state of hydrates without dehydration.

Examples 1, 2, 3 and 4

Figure 3:
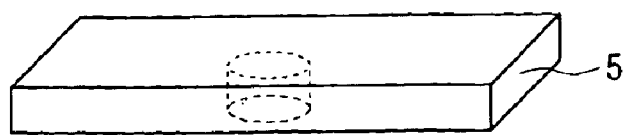
FIG. 3 is a perspective view schematically showing a substrate employed in Examples 1 to 6 and Comparative Examples 1 to 2.
Figure 4:
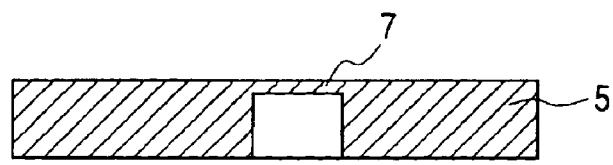
FIG. 4 is a cross-sectional view schematically showing a substrate employed in Examples 1 to 6 and Comparative Examples 1 to 2.
Figure 5:
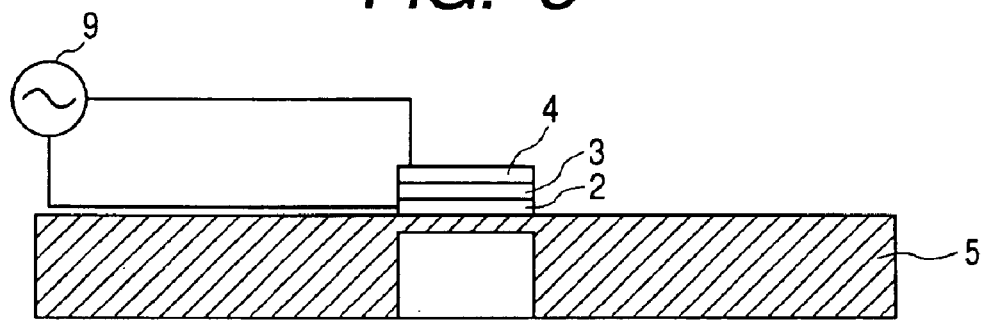
FIG. 5 is a cross-sectional view schematically showing a piezoelectric element prepared in Examples 1 to 6 and Comparative Examples 1 to 2.

On a Zirconia substrate (3 cm square) having a partial recess on a rear surface as shown in FIGS. 3 and 4, each of the coating liquids obtained in the Preparation Examples 1, 2, 3 and 4 of the coating liquid was spin coated at a substrate temperature of 25° C. and in the presence of air having a relative humidity of 35% RH at 25° C., and dried for 5 minutes by heating the air of a relative humidity of 35% RH at 25° C. to a temperature of 100° C. (substrate temperature 100° C.) (drying step). It was then heat treated, in a tubular oven of a diameter of 5 cm and a length of 100 cm (including a heater portion of 30 cm) and under a gas flow containing oxygen by 30 vol % and nitrogen by 70 vol % and having a relative humidity of 80% RH at 25° C., with a flow speed of 1 L/(cm$^2$·min), for 5 minutes at a substrate temperature of 400° C. (preliminary sintering step), and was heat treated in the same atmosphere for 5 minutes at a substrate temperature of 650° C. (final sintering step). After the coating and heating explained above were repeated three times, a finally sintering was executed, in the above-mentioned tubular oven and in the presence of a gas containing oxygen by 30 vol % and nitrogen by 70 vol % and having a relative humidity of 75% RH at 25° C., for 40 minutes at 700° C. (final sintering step). Then a cooling to the room temperature was conducted in the same humidity atmosphere (cooling step). Subsequently a platinum upper electrode was formed by sputtering to obtain a piezoelectric element of the present invention. FIG. 5 is a schematic cross-sectional view of the piezoelectric element obtained in these examples.

A fluorescent X-ray analysis of an intermediate portion of the piezoelectric film, in a piezoelectric film prepared with the coating liquid of Preparation Example 1, provided a composition of Pb: 1.0, Zr: 0.52 and Ti: 0.48. Similar results were obtained also in the piezoelectric films prepared with the coating liquids of Preparation Examples 2, 3 and 4.

The piezoelectric films of Examples 1, 2, 3 and 4 had following film thickness.

TABLE 2

| Example | Preparation Examples of coating liquid | Film thickness ($\mu$m) |
| --- | --- | --- |
| 1 | 1 | 1.18 |
| 2 | 2 | 1.58 |
| 3 | 3 | 1.35 |
| 4 | 4 | 2.68 |

Examples 5, 6, 7 and 8

On a substrate similar to that in the Examples 1, 2, 3 and 4, each of the coating liquids obtained in the Preparation Examples 5, 6, 7 and 8 was spin coated in the presence of air having a relative humidity of 50% RH at 25° C., and dried for 5 minutes by heating the air of a relative humidity of 50% RH at 25° C. to a temperature of 100° C. (drying step). It was then heat treated, in a tubular oven of a diameter of 5 cm and a length of 100 cm (including a heater portion of 30 cm) and in the presence of a gas containing oxygen by 30 vol % and nitrogen by 70 vol % and having a relative humidity of 90% RH at 25° C., for 20 minutes at 300° C. (preliminary sintering step). After the coating and heating explained above were repeated three times, a finally sintering was executed, in the above-mentioned tubular oven and in the presence of a gas containing oxygen by 40 vol % and nitrogen by 60 vol % and having a relative humidity of 70% RH at 25° C., for 40 minutes at 600° C. (final sintering step). Then a cooling to the room temperature was conducted in the same humidity atmosphere (cooling step). Subsequently a platinum upper electrode was formed by sputtering to obtain a piezoelectric element of the present invention.

An analysis of an intermediate portion of the piezoelectric film in Examples 5 to 8 provided a composition of Pb: 0.99, La: 0.01, Zr: 0.52 and Ti: 0.48.

The film thickness after coating and finally sintering three times was as follows.

TABLE 3

| Example | Preparation Examples of coating liquid | Film thickness ($\mu$m) |
|---|---|---|
| 5 | 5 | 1.42 |
| 6 | 6 | 2.43 |
| 7 | 7 | 1.49 |
| 8 | 8 | 1.38 |

Example 9

A piezoelectric element was obtained in a similar manner as in Example 5, except that the drying was conducted for 5 minutes at 150° C. with air of a relative humidity of 60% at 25° C., that the preliminarily sintering was conducted with air of a relative humidity of 80% at 25° C. by elevating the temperature from 400 to 600° C. at a rate of 2° C./min and that the finally sintering was executed, upon reaching 600° C., by maintaining this temperature for 10 minutes.

An analysis of an intermediate portion of the piezoelectric film provided a composition of Pb: 1.02, La: 0.01, Zr: 0.52 and Ti: 0.48. The film thickness after coating and finally sintering ten times was 4.15 $\mu$m.

Example 10

A piezoelectric element was prepared in a similar manner as in Example 1 except that the substrate was changed from a zirconia substrate to a Si wafer.

The film thickness after coating and finally sintering three times was 1.27 $\mu$m.

Comparative Examples 1 and 2

Piezoelectric elements were obtained in a similar manner as in Examples 1 and 2, except that air having a relative humidity of 35% RH at 25° C. was employed in the drying step, the preliminary sintering step and the final sintering step.

Comparative Examples 3 and 4

Piezoelectric elements were obtained in a similar manner as in Examples 5 and 6, except that air having a relative humidity of 50% RH at 25° C. was employed in the drying step, the preliminary sintering step and the final sintering step.

Comparative Example 5

A piezoelectric element was obtained in a similar manner as in Example 1, except that a gas including oxygen by 10 vol % and nitrogen by 90 vol % and having a relative humidity of 80% RH at 25° C. was employed in the steps from preliminarily sintering to cooling.

Evaluation

The piezoelectric elements and ink jet recording heads of Examples 1, 2, 3, 4, 5, 6, 7, 8, 9 and 10 and Comparative Examples 1, 2, 3, 4 and 5 were evaluated in the following manner.
(1) Displacement Amount An amount of displacement, under an application of a voltage of 10 V, 10 kHz between the upper electrode and the lower electrode, was measured by a laser Doppler method for evaluating the displacement amount of the piezoelectric element. Table 4 shows obtained results. As will be observed from Table 4, the elements of Examples showed larger displacement amounts in comparison with those of Comparative Examples. Also the elements of Examples were stable in the displacement amount after a durability test for 720 hours, indicating a satisfactory durability.

TABLE 4

| | Initial displacement ($\mu$m) | Displacement after operation for 720 hours ($\mu$m) |
|---|---|---|
| Example 1 | 0.5 | 0.5 |
| Example 2 | 0.4 | 0.3 |
| Example 3 | 0.5 | 0.5 |
| Example 4 | 0.6 | 0.6 |
| Example 5 | 0.7 | 0.7 |
| Example 6 | 0.7 | 0.7 |
| Example 7 | 0.4 | 0.3 |
| Example 8 | 0.4 | 0.4 |
| Example 9 | 0.9 | 0.9 |
| Example 10 | 0.5 | 0.5 |
| Comp. Ex. 1 | evaluation impossible due to cracks in coating | |
| Comp. Ex. 2 | " | |
| Comp. Ex. 3 | " | |
| Comp. Ex. 4 | " | |
| Comp. Ex. 5 | 0.1 | no displacement observed |

(2) Preparation of Ink Jet Recording Head and Evaluation thereof (of Preparation of Ink Jet Recording Head)

Figure 6:
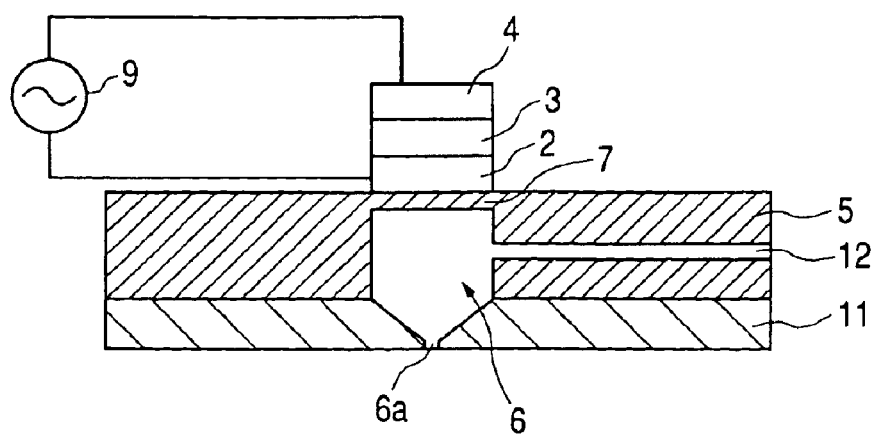
FIG. 6 is a cross-sectional view schematically showing an ink jet recording head of the present invention.
Figure 7:
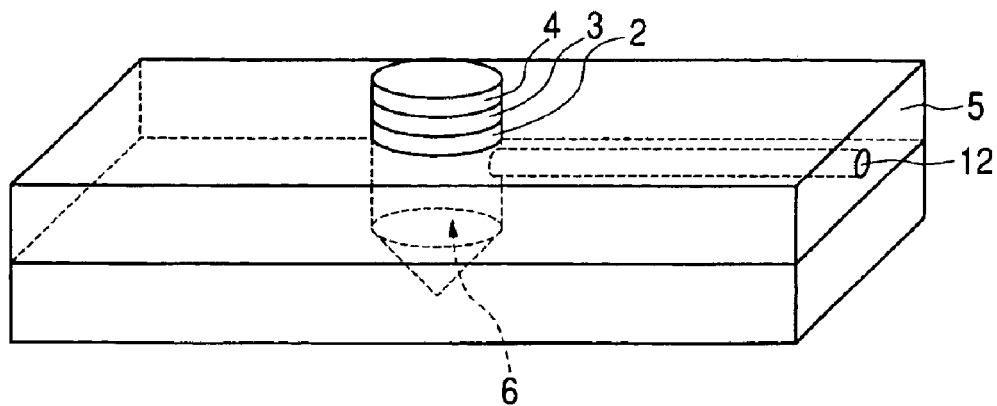
FIG. 7 is a perspective view schematically showing a head portion of an ink jet recording head of the present invention.

On each of the piezoelectric elements prepared in Examples 1 to 6 and Comparative Example 5, a nozzle plate 11 having a nozzle 6a was mounted and a introducing path 12 for ink introduction was provided as shown in FIGS. 6 and 7 to prepare an ink jet recording head.

Evaluation of Ink Jet Recording Head

Ink for ink jet recording was filled in the ink chamber of thus prepared ink jet recording head from the introducing path. Then an AC voltage of 10 V and 1–20 kHz was applied between the upper electrode and the lower electrode, and a state of ink discharge was observed under a microscope.

The ink jet recording heads of Examples 1, 2, 3, 4, 5 and 6 could discharge ink droplets responding to each frequency. On the other hand, the ink jet recording head of Comparative Example 5 could not discharge ink droplets uniformly within a range of 15 to 20 kHz.
(3) Other Evaluations A polarization to an applied electric field was measured in the piezoelectric elements prepared in Example 1 and Comparative Example 1. The measurement was conducted, with HVS-6000 manufactured by Radiants Inc., by applying a voltage of 20 V to the element to obtain a hysteresis curve, which is shown in FIG. 8.

Figure 8:
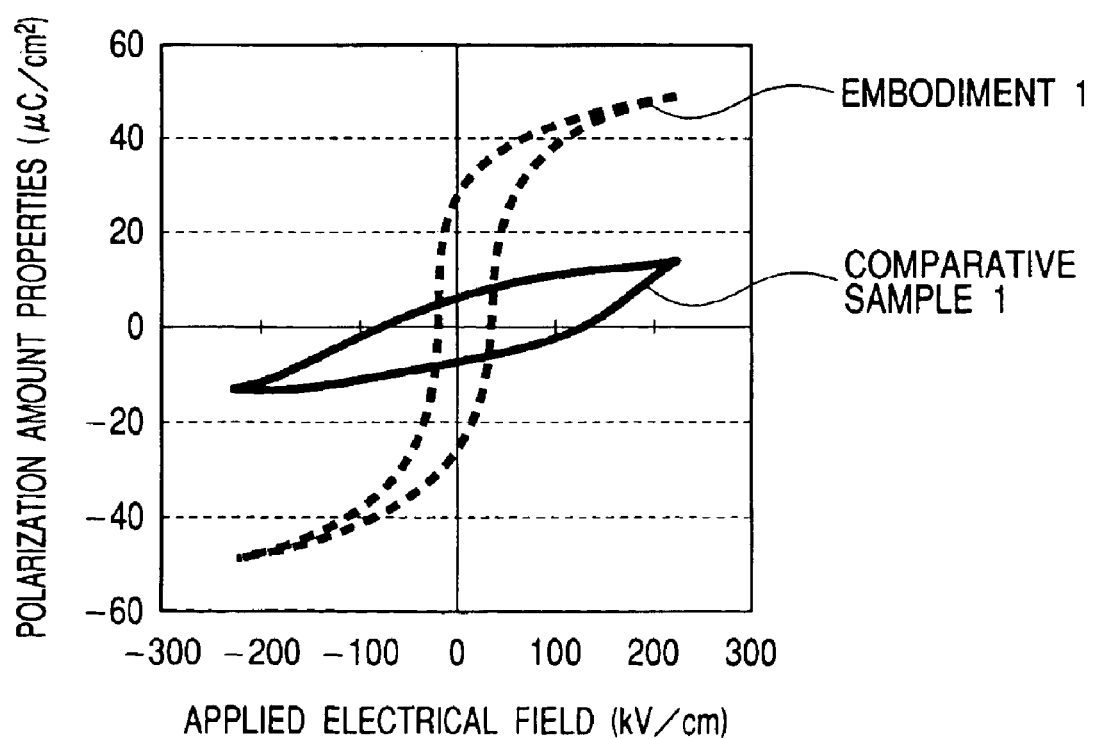
FIG. 8 is a chart showing hysteresis curves of piezoelectric elements of Example 1 and Comparative Example 1.

FIG. 8 indicates that the piezoelectric element of Example 1 showed a larger retentive polarization than the piezoelectric element of Comparative Example 1. Since such apparent hysteresis can be utilized as a memory element, a memory can be constructed by arranging a plurality of such elements in such a manner that a voltage can be applied individually. More specifically, it can be utilized as a rewritable memory by writing information by supplying a drive signal according to the information to be recorded and by reading information by detecting the direction of polarization. In the use as such memory, the piezoelectric film preferably has a thickness of 0.1 to 2 $\mu$m.

As explained in the foregoing, the piezoelectric film prepared according to the present invention is usable not only as a piezoelectric element of an ink jet recording head but also in various devices such as a memory, a capacitor, a sensor or an optical modulator.

What is claimed is:

1. A method for manufacturing a piezoelectric element comprising:

a coating step of coating a substrate with a coating liquid for forming the piezoelectric element thereby forming a coated film;

a drying step of drying said coated film;

a preliminary sintering step of sintering said coated film thereby forming an oxide film;

a final sintering step of sintering said oxide film thereby forming a piezoelectric film; and a cooling step of cooling said piezoelectric film, wherein said coating step is executed in the presence of a moisture-containing gas having a relative humidity of 60% RH or less at 25° C., and, in said coating step, said substrate has a temperature equal to or less than 50° C., wherein said drying step is executed in the presence of a moisture-containing gas having a relative humidity of 10 to 70% RH at 25° C., and, in said drying step, said substrate has a temperature equal to or less than 200° C., wherein said preliminary sintering step is executed in the presence of a moisture-containing gas having a relative humidity of 70 to 100% RH at 25° C., and, in said preliminary sintering step, said substrate has a temperature of 200 to 450° C., and wherein said final sintering step is executed in the presence of a moisture-containing gas having a relative humidity of 70 to 100% RH at 25° C., and, in said final sintering step, said substrate has a temperature of 500 to 800° C.

2. A method for manufacturing a piezoelectric element according to claim 1, wherein the moisture-containing gas present in said preliminary sintering step, the moisture-containing gas present in said final sintering step, and the moisture-containing gas present in said cooling step each contains oxygen by 10 vol % or more.

3. A method for manufacturing a piezoelectric element according to claim 1, wherein said coating liquid includes a raw material component of said piezoelectric film, with said piezoelectric film containing at least one of Pb, La, Zr, and Ti as a constituent element.

4. A method for manufacturing a piezoelectric element according to claim 1, wherein said coating liquid includes a raw material component of said piezoelectric film obtained by reacting (a) a metal alkoxide or a metal salt and (b) water in a solvent having a boiling point equal to or higher than 100° C. or in a solvent containing such solvent.

5. A method for manufacturing a piezoelectric element according to claim 1, wherein said cooling step is executed in the presence of a moisture-containing gas having a relative humidity of 70 to 100% RH at 25° C.

* * * * *